United States Patent [19]

Hahs, Jr.

[11] Patent Number: 4,969,827

[45] Date of Patent: Nov. 13, 1990

[54] MODULAR INTERCONNECTING ELECTRONIC CIRCUIT BLOCKS

[75] Inventor: Charles A. Hahs, Jr., Boca Raton, Fla.

[73] Assignee: Motorola, Inc., Schaumburg, Ill.

[21] Appl. No.: 364,957

[22] Filed: Jun. 12, 1989

[51] Int. Cl.[5] .............................................. H01R 9/09
[52] U.S. Cl. ....................................... 439/68; 357/68; 361/395; 361/400
[58] Field of Search ......................... 174/52.4; 357/68; 361/394, 395, 400, 401; 439/55, 65, 68, 69, 70, 71, 72, 73, 74, 75, 78, 81, 82

[56] References Cited

U.S. PATENT DOCUMENTS

| | | | |
|---|---|---|---|
| 2,938,068 | 5/1960 | Silverschotz | 439/82 |
| 4,084,869 | 4/1978 | Yen | 439/651 |
| 4,760,335 | 7/1988 | Lindberg | 361/400 |
| 4,833,568 | 5/1989 | Berhold | 361/383 |

Primary Examiner—Eugene F. Desmond
Attorney, Agent, or Firm—Daniel R. Collopy; Vincent B. Ingrassia; Anthony Sarli, Jr.

[57] ABSTRACT

A modular building block for electronic circuitry is provided with areas for mounting circuitry thereon. Posts of a particular geometric shape and receptacles of a complementary geometric shape are provided on the substrate. The posts and receptacles are coated with an electrically conductive material and connected to nodes within the circuit such that when blocks are interconnected, post within receptacle, the interconnection provides both physical and electrical connection. An alternate embodiment is disclosed having fingers and edge cards, configured such that the fingers of one block grasp the edge cards of another block, providing physical and electrical connection between the blocks.

7 Claims, 4 Drawing Sheets

MODULAR INTERCONNECTING ELECTRONIC CIRCUIT BLOCKS

FIELD OF THE INVENTION

This invention relates in general to modular electronic circuitry building blocks, and more specifically to interconnectable modular circuit blocks which provide reliable physical and electrical connections between adjoining blocks.

BACKGROUND OF THE INVENTION

With the proliferation of electronic articles in today's world, a need has arisen for ease of manufacture and a personalization of these articles. Various bulk purchasers of electronic articles require unique physical specifications for the final product. This has led manufacturers to look for basic building blocks for their products. One solution has been for manufacturers to place circuitry common to their manufacture on integrated circuits. This solution is limited to circuits which have components or suitable substitutes which can be placed on an integrated circuit.

Another approach to the goal of personalizing electronic articles is the peripheral slots located within the personal computers of today. Most personal computers (pc's) have slots within the pc for receiving computer peripheral "cards". In this manner a pc owner can purchase his preferred computer peripheral cards and insert them into the provided slots. The drawback with this scheme is that room has to be set aside within the pc for the cards. Also, the slots are specially manufactured so that they can physically hold the cards within the pc. The electrical connections are maintained by separate contacts which are composed of several components to guarantee a reliable electrical connection.

Neither of these solutions are acceptable for use in electronic articles where the room cannot be set aside for slots and cards, and the circuitry is too complex and/or composed of elements unadaptable for integrated circuitry. Complex circuits used in articles today are composed of several integrated circuits. Also, many electronic articles are used today in a manner which requires firm physical and electronic connections within the article. For example, some articles are worn on the person. Other end users of articles specify that the article be able to withstand various forces placed on it either through expected user negligence or usage of the article in a hazardous environment.

Thus, what is needed is modular electrical circuitry blocks which can be joined in a variety of geometrical shapes for providing a personalized shape to the resulting electronic article. The blocks need a means for providing firm electrical and physical connections between the blocks.

SUMMARY OF THE INVENTION

Accordingly, it is an object of the present invention to provide interconnecting modular electronic circuit blocks.

It is a further object of the present invention to provide interconnecting modular electronic circuit blocks allowing for firm physical interconnection as well as reliable electrical interconnection between the blocks.

It is also an object of the present invention to provide a means for interconnecting modular electronic blocks in a plurality of orientations so that the resultant electronic article may be formed in various shapes to meet a multitude of customer specifications.

The present invention is a substrate capable of placing electronic circuitry thereon, having at least one receptacle formed within the substrate so as it can receive a complementary formed projection on another substrate. The connection between the projection and the receptacle provides electrical connection between the electronic circuits carried on the two substrates. The connection between the projection and the receptacle may also provide physical connection between the two substrates.

That the present invention accomplishes the above-stated objects and overcomes the drawbacks of the prior art will be appreciated from the detailed description of the preferred embodiment to follow.

DETAILED DESCRIPTION OF THE INVENTION

Figure 1:
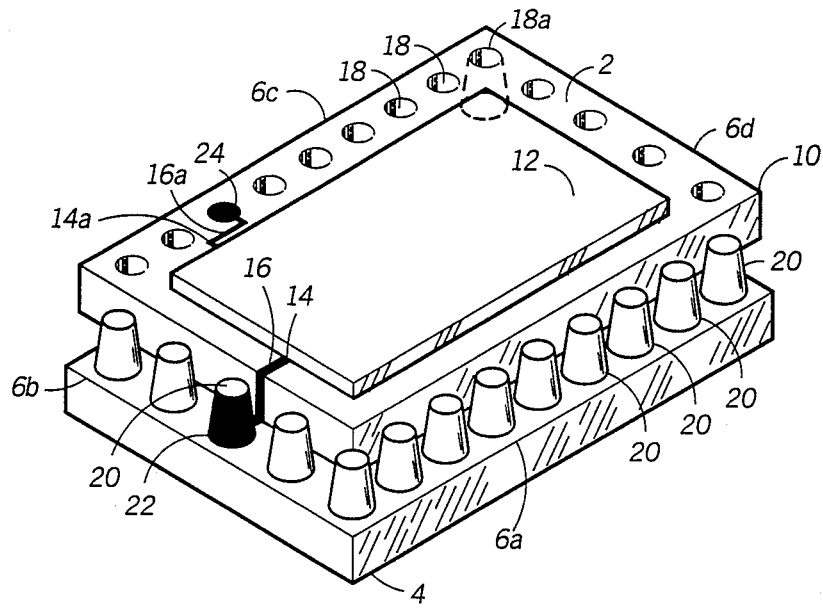
FIG. 1 is a perspective view of the preferred embodiment of the present invention.

Referring to FIG. 1, a solid rectangular-shaped substrate 10, with a top 2, a bottom 4 and four edges 6a–6d, has a circuit 12 placed on top of it. Electrical connections 14 and 14a are metal leads connected to input/output nodes of circuit 12. Connection 14 is connected to a conductive routing material 16 which would provide conduction of electrical signals from connection 14 to another point on substrate 10. Likewise, connection 14a is connected to a conductive routing material 16a which would provide conduction of electrical signals from connection 14a to another point on substrate 10.

Formed within substrate 10 are receptacles 18. Receptacles 18 line sides 6c and 6d of substrate 10. It is obvious to one skilled in the art that the number of sides is not limited to four and that the receptacles may be lined on half, more than half, or less than half of the sides of the substrate. Along sides 6a and 6b are geometrical shaped posts 20. Posts 20 are complementary in shape to receptacles 18 such that posts 20 fit snugly within receptacles 18. In order for posts 20 to provide electrical connection between circuit blocks, they are coated with electrical conductive material 22. Conductive material 24 is placed within receptacles 18 to provide electrical connections between circuit blocks. In the preferred embodiment, posts 20 are conical in shape. Likewise, receptacles 18 are conically formed (shown in phantom at 18a).

Routing material 16 terminates at one end at connection 14. At its other end, conductive routing material 16 terminates at conductive material 22 on one of posts 20. Routing material 16a likewise terminates at one end at connection 14a and, at its other end, at conductive material 24 in one of receptacles 18. In the preferred embodiment, the electrically conductive material used as material 22, material 24 and routing material 16 and 16a is a highly conductive material such as gold, graphite or paladium.

Referring to FIG. 1, connection 14 is shown as connected to a post 20 by routing 16, and connection 14a is shown as connected to a receptacle 18 by routing 16. If connections 14 and 14a are electrically connected to the same input/output node within circuit 12, two possible configurations for substrate 10 to be connected to another circuit block would be possible. It is obvious to one skilled in the art that the number of configurations is limited by the geometric shape of substrate 10 and the number of posts and receptacles to which each input/output node within circuit 12 is routed. For example a solid hexagonal shaped substrate with each connection routed to a post or receptacle on each of the six sides of the substrate would allow for six possible configurations for the substrate to be connected to another circuit block.

It is also obvious to one skilled in the art that one side of a substrate block could be adjoined to more than one circuit block. For example, a row of eight geometrically shaped posts could be connected to two circuit blocks with four receptacles on each. Also, the posts could be an integral part of the housing for an electronic article, providing electrical connection between a circuit block receptacle and an electrical component on the outside of the housing, such as a switch, a display or an electrical socket. Also, a substrate lined with receptacles on all sides could be used as a connector for routing signals without any circuitry mounted thereon.

In the preferred embodiment, the posts and receptacles are conically shaped for providing ease of moldability of the substrate. The draft angles provided by the conical shape allow use of an inexpensively tooled mold which can be easily removed from a newly molded substrate. The conical shaped posts and receptacles also provide a large area of contact, thereby improving electrical contact. In determining the composition of conductive material 22 and 24, one must balance the coefficient of friction of the material against its conductivity. The conical shape allows a large area of post and receptacle to be placed in physical contact providing a reliable electrical connection between a post 20 and a corresponding receptacle 18. Also, in the preferred embodiment, after blocks are placed together in the proper configuration, the top of posts 20 are heated in such a manner as to allow them to expand, forming a lip above receptacle 18. The lip so formed prevents post 20 from pulling through receptacle 18 providing a highly reliable physical connection between circuit blocks.

It would be obvious to one skilled in the art that a second circuit could be placed on the bottom 4 of substrate 10. Also, if a particular circuit 12 had a large number of connections 14 and placing all routing 16 on the top 2 of substrate 10 became difficult, it would be obvious to one skilled in the art that circuit 12 could be placed on the top 2 or the bottom 4 of substrate 10 and the routing 16 on both the top and the bottom of substrate 10 using via holes through substrate 10. It would also be obvious to one skilled in the art that circuit 12 could be embedded within substrate 10 so that routing 16 for connections 14 could be provided on both the top and the bottom of substrate 10.

It is also obvious to one skilled in the art that posts could be placed on all sides of the substrate, with the posts hollowed out in a complementary geometric pattern for receptacles. In this manner a large number of connections could be provided with a correspondingly larger variety of configurations of block interconnection, with adjoining blocks capable of being mounted above and below the substrate block.

Figure 2:
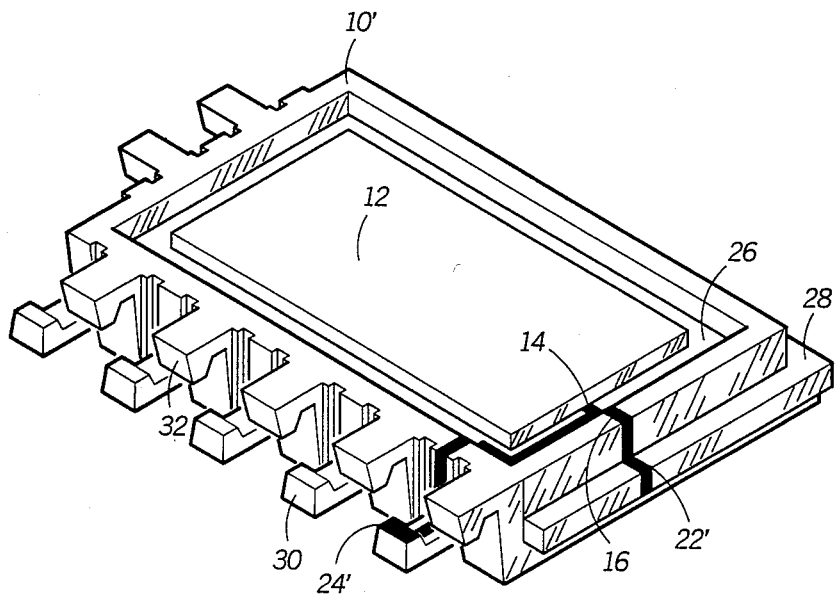
FIG. 2 is a perspective view of an alternate embodiment of the present invention.

Turning now to FIG. 2, a top perspective view is depicted of an alternate embodiment of the present invention. A modular circuit block substrate 10' is shown with circuit 12 mounted within recessed area 26. Circuit 12 is connected to electrically conductive routing material 16 at connection 14. An edge card 28 is provided to place portions of electrically conductive material 22' for electrical connections to another circuit block. Alternating lower fingers 30 and upper fingers 32 are provided for connecting to an edge card of another circuit board. Electrically conductive material 24' is provided on the inside of fingers 30 and 32 to provide electrical connections to another circuit block. Routing material 16 is routed to both conductive material 22' on edge card 28 and conductive material 24' on a lower finger 30.

The distance between the highest portion of lower finger 30 and the lowest portion of upper finger 32 is less than the width of edge card 28 such that when physical connection is made between adjoining circuit blocks, the edge card forces fingers 30 and 32 apart. This aids in making a more reliable physical connection between circuit blocks. Further, by placing solder or conductive epoxy upon material 22' and 24' before joining fingers 30 and 32 on one circuit block to edge cards 28 on another circuit block, a more reliable electrical connection may be formed. It is obvious to one skilled in the art that edge card 28 on a circuit block could be formed in such a manner that fingers 30 and 32 on a second circuit block could lock themselves over a portion of edge card 28 so that they would have to be pried apart in order to disconnect the two circuit blocks.

Figure 3:
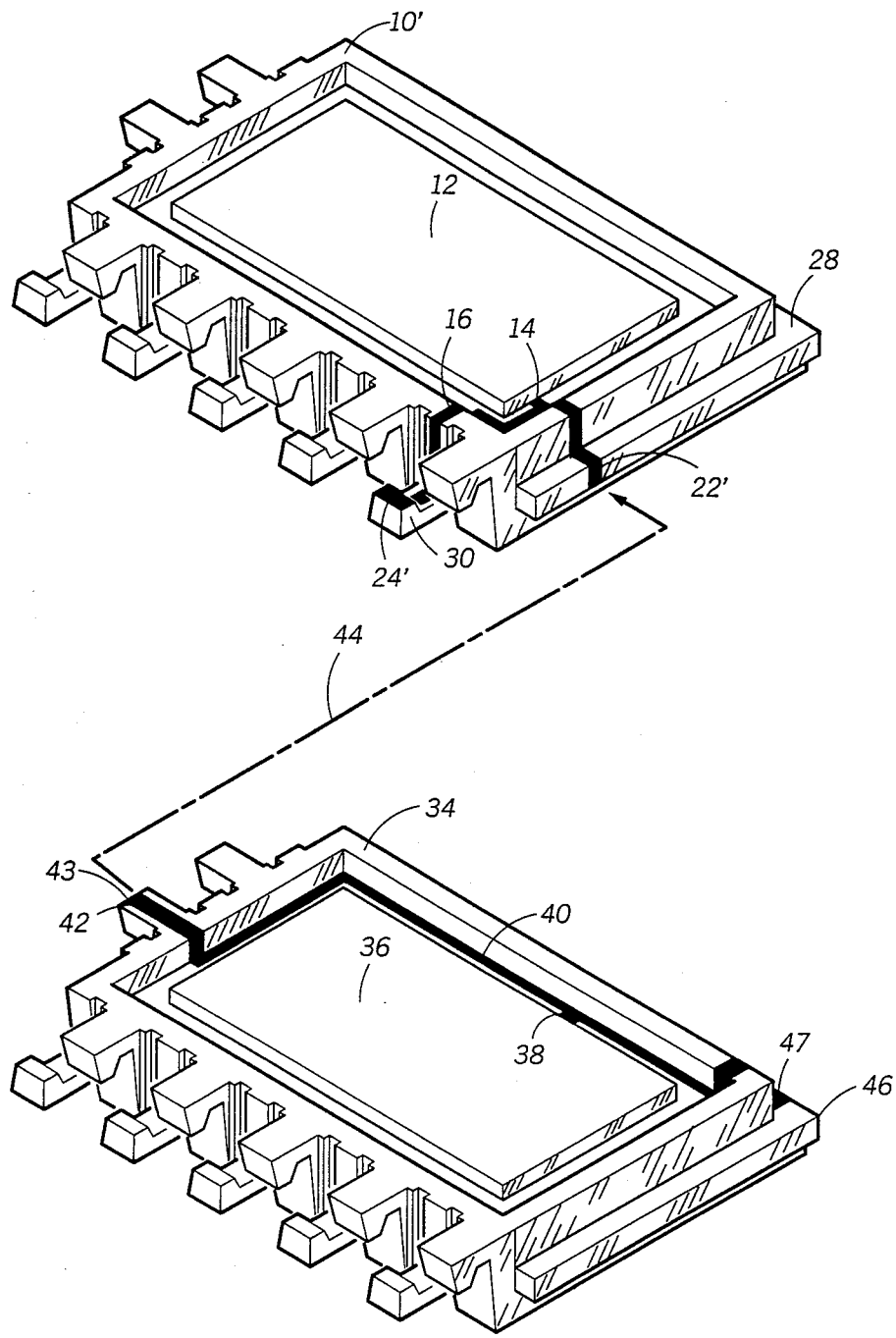
FIG. 3 is a perspective view of a first configuration for interconnecting embodiments of the present invention.
Figure 4:
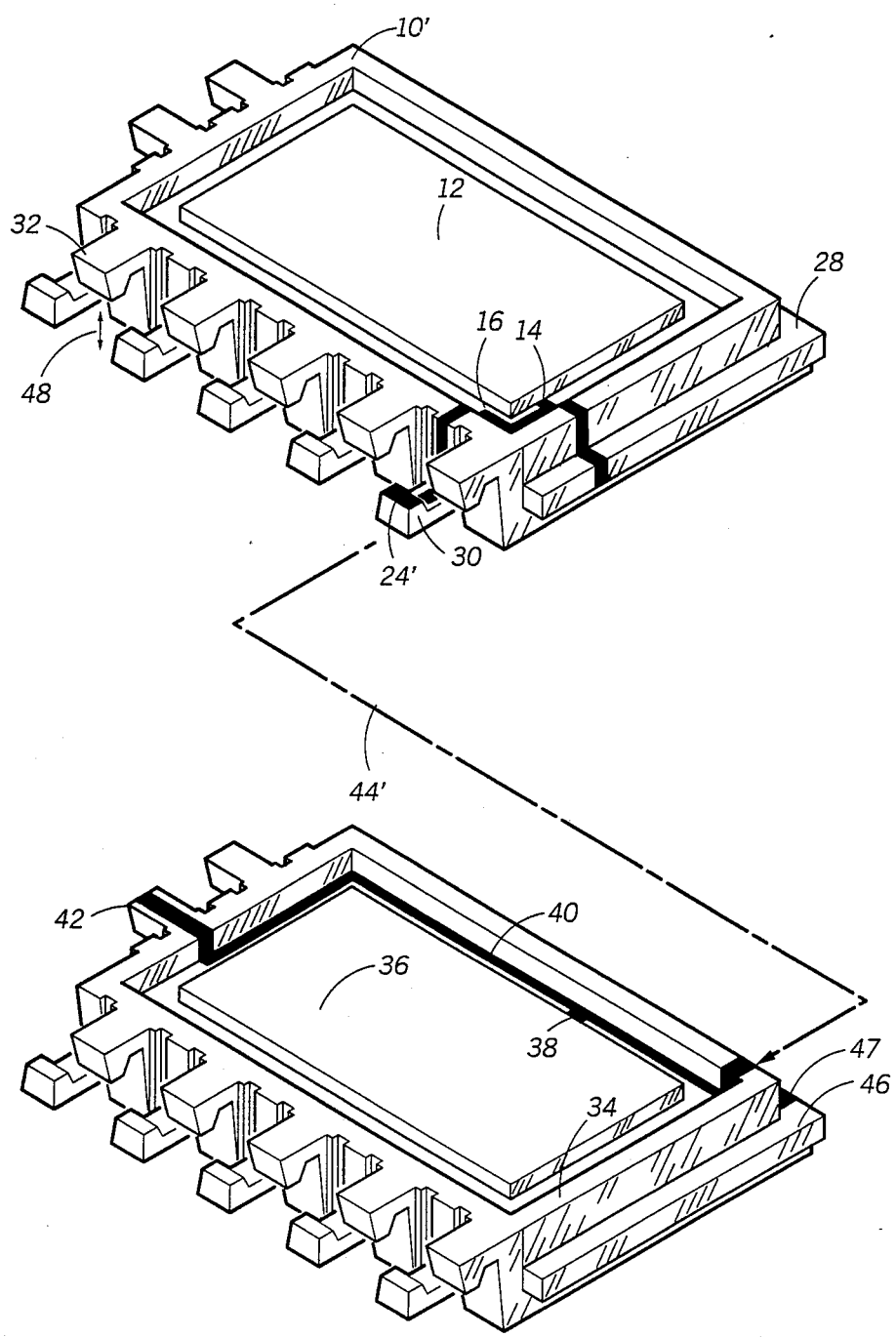
FIG. 4 is a perspective view of a second configuration for interconnecting embodiments of the present invention.

Turning now to FIGS. 3 and 4, perspective views of two interconnecting circit blocks are shown. Referring to FIG. 3, substrate 10' is shown with circuit 12 mounted thereon. A second substrate 34 is also shown with circuit 36 mounted thereon. When substrate 10' and substrate 34 are connected, an electrical connection is made from connection 14 to connection 38. Connection 14 is conductively connected to conductive routing material 16 which in turn is conductively connected to conductive material 22' on edge card 28 and conductive material 24' on lower finger 30. Likewise, connection 38 is conductively connected to conductive routing material 40 which in turn is conductively connected to conductive material 47 on edge card 46 and conductive material 43 on finger 42. When substrate 34 is urged in the direction of arrow 44, substrate 34 becomes interconnected with substrate 10'. An electrical connection is made as conductive material 43 which wraps around finger 42 makes contact with conductive material 22' on edge card 28. In this manner, the node in circuit 36 electrically connected to connection 38 is electrically connected to the node in circuit 12 electrically connected to connection 14.

Referring to FIG. 4, substrates 10' and 34 are shown being connected in an alternate configuration. When substrate 10' is urged in the direction of arrow 44' to interconnect with substrate 34, upper fingers 32 and lower fingers 30 separate in the directions of arrow 48 so that the fingers firmly grasp edge card 46. As in FIG. 3, the node in circuit 36 electrically connected to connection 38 is electrically connected to the node in circuit 12 electrically connected to connection 14. The electrical connection is made via conductive material 24' on finger 30 held in contact with conductive material 47 which wraps around edge card 46.

In viewing FIGS. 3 and 4, it can be seen that the pictured embodiment allows at least two configurations for an end product composed of the two electronic circuit blocks: substrate 10' and substrate 34. If, for example, the circuit blocks each measured three inches by six inches, the configuration of FIG. 3 would measure three inches by twelve inches. This configuration would be suitable for a handheld electronic apparatus. The configuration of FIG. 4 would measure six inches by six inches, unsuitable for a handheld apparatus but suitable for other uses.

By now it should be appreciated that there has been provided circuit building blocks which would allow for a variety of configurations of the same circuit to provide ease of manufacture of personalized electronic articles.

I claim:

1. A first circuit carrying substrate comprising:
   first means for receiving a first electrical circuit comprising a first plurality of nodes; and
   second means for physically coupling in at least two geometrical relationships and electrically coupling said first substrate to a second circuit carrying substrate carrying thereon a second electrical circuit comprising a second plurality of nodes, said second means comprising:
   third means for physically coupling said first substrate to said second substrate in a first of said at least two geometrical relationships and for electrically interconnecting said first plurality of nodes to said second plurality of nodes, said third means comprising at least one geometrically shaped receptacle formed in said first substrate and electrically coupled to one of said first plurality of nodes for receiving and electrically coupling to a first complementary shaped portion of said second circuit carrying substrate electrically coupled to one of said second plurality of nodes; and
   fourth means for alternatively physically coupling said first substrate to said second substrate in a second of said at least two geometrical relationships and for similarly electrically interconnecting said first plurality of nodes to said second plurality of nodes, said fourth means comprising at least one geometrically shaped portion electrically coupled to said one of said first plurality of nodes for inserting into and electrically coupling to a complementary shaped receptacle formed in said second circuit carrying substrate electrically coupled to said one of said second plurality of nodes.

2. The substrate of claim 1, wherein said geometrically shaped portion is conical.

3. The substrate of claim 1, having formed thereon at least a first edge and a second edge wherein said at least one geometrically shaped receptacle and said at least one geometrically shaped portion are proximally located at said first and said second edge, respectively, of said first substrate.

4. The substrate of claim 3, wherein said first edge is located opposite to said second edge.

5. A circuit carrying substrate comprising:
   a first portion for receiving a first circuit, said first circuit comprising a first plurality of nodes;
   a second portion coupled to said first plurality of nodes for providing electrical connections from said first plurality of nodes to a second plurality of nodes within a second circuit carried on another circuit carrying substrate; and
   a third portion similarly coupled to said first plurality of nodes for alternatively providing substantially similar electrical connections between said first plurality of nodes and said second plurality of nodes as said second portion so as to provide similar operation of the first circuit regardless of which of the second or the third portions are used for said electrical connections between said first plurality of nodes and said second plurality of nodes.

6. The substrate of claim 5, wherein said second portion comprises at least one geometrically shaped receptacle for receiving a complementary shaped portion on said second substrate, and said third portion comprises at least one geometrically shaped member for insertion into a complementary shaped receptacle on said second substrate.

7. The substrate of claim 5, wherein said second portion and said third portion provide physical connections between said first and second substrates as well as said electrical connections therebetween.

* * * * *